United States Patent [19]

Takemae

[11] Patent Number: 4,581,722
[45] Date of Patent: Apr. 8, 1986

[54] DYNAMIC RANDOM ACCESS MEMORY HAVING SMALL CYCLE TIME PERIOD

[75] Inventor: Yoshihiro Takemae, Tokyo, Japan
[73] Assignee: Fujitsu Limited, Kawasaki, Japan
[21] Appl. No.: 671,765
[22] Filed: Nov. 15, 1984
[30] Foreign Application Priority Data Nov. 16, 1983 [JP] Japan ............................ 58-214155

[51] Int. Cl.$^4$ .............................................. G11C 8/00
[52] U.S. Cl. .................................................. 365/230
[58] Field of Search ................................ 365/189, 230
[56] References Cited

U.S. PATENT DOCUMENTS

| 4,376,989 | 3/1983 | Takemae | 365/230 |
| 4,396,845 | 8/1983 | Nakano | 365/230 |
| 4,472,792 | 9/1984 | Shimohigashi et al. | 365/230 |
| 4,509,148 | 2/1985 | Asano et al. | 365/230 |

OTHER PUBLICATIONS

IEEE International Solid–State Circuits Conference, "A 35ns 64K Static Column DRAM", by Baba et al., ISCC 83, Feb. 23, 1983, pp. 64–65.

Primary Examiner—James W. Moffitt
Attorney, Agent, or Firm—Staas & Halsey

[57] ABSTRACT

A dynamic random access memory wherein a memory access operation is started by receiving an address strobe signal ($\overline{RAS}$, $\overline{CAS}$), after which address signals ($RA_i$, $\overline{RA}_i$, $CA_i$, $\overline{CA}_i$) are applied via address buffers (2, 6) to address decoders (3', 7'). The address buffers (2, 6) and the NOR gates (31, 71) of the decoders (3', 7') are automatically reset earlier during the active operation, while the drivers (32, 72) of the decoders (3', 7') and their subsequent circuits are reset after the completion of the active period defined by the strobe signal.

5 Claims, 10 Drawing Figures

DYNAMIC RANDOM ACCESS MEMORY HAVING SMALL CYCLE TIME PERIOD

BACKGROUND OF THE INVENTION

1. Field of the Invention

The present invention relates to a random access memory (RAM) which has a small cycle time period compatible with static RAM's which can carry out a so-called read-modified write operation.

2. Description of the Related Art

Recently, dynamic RAM's have come into increased use for storing video data. Such devices must allow a large amount of data to be read out and written therein per unit time, i.e., must offer a reduced cycle time period. Generally, in a dynamic RAM, each cycle time period includes one access time period for an actual read/write operation and one reset time period for precharging each portion of the device prior to each access operation. The reset time period is of the same order as an access time period. Therefore, each cycle time period of a dynamic RAM is relatively long.

In the prior art, a small cycle time period is available with a static column type dynamic RAM (F. Baba et al, "A 35 ns 64K Static Column DRAM", 1983 IEEE ISSCC Digest of Technical Papers, Article WPM6.5, pp.65–64, Febuary 1983). This dynamic RAM offers a cycle time period during a page mode about the same as its access time period. This dynamic RAM, however, includes static circuits. Therefore, there is a disadvantage of a rather large power consumption.

In another prior art dynamic RAM offering a small cycle time period (U.S. Pat. No. 4,376,989), each circuit thereof is automatically reset, i.e., precharged by the subsequent circuit thereof after the completion of its own operation. Therefore, its own reset time period is small, thereby reducing the cycle time period. In such a dynamic RAM, however, since all the circuits thereof are automatically reset, it is impossible to carry out a read-modified write operation. As a result, a dynamic RAM of this type is not compatible with conventional dynamic RAM's.

SUMMARY OF THE INVENTION

It is an object of the present invention to provide a dynamic RAM which has a small cycle time period and is compatible with conventional dynamic RAM's which can carry out a read-modified write operation.

It is another object of the present invention to provide a dynamic RAM having low power consumption.

According to the present invention, in a dynamic RAM wherein a memory access operation is started by receiving an external signal, such as a row address strobe signal $\overline{RAS}$ or a column address strobe signal $\overline{CAS}$, address signals are applied from address buffers to address decoders, which include NOR gates for decoding the address signals and drivers for driving an internal circuit including word lines, memory cells, bit lines, and the like. The address buffers and the NOR gates are automatically reset earlier during an access operation defined by the strobe signal, while the drivers and their subsequent circuits are reset after the completion of the active period defined by the strobe signal. As a result, since the reset time period decreases, the cycle time period also decreases.

Also, since the internal circuit remains in a selected state even after the address buffers and the NOR gates are reset, it is possible to perform a write operation upon the internal circuit. Therefore, the dynamic RAM according to the present invention is compatible with conventional dynamic RAM's.

Further, the dynamic RAM according to the present invention has no static circuits, and therefore has a low power consumption.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENT

Figure 1:
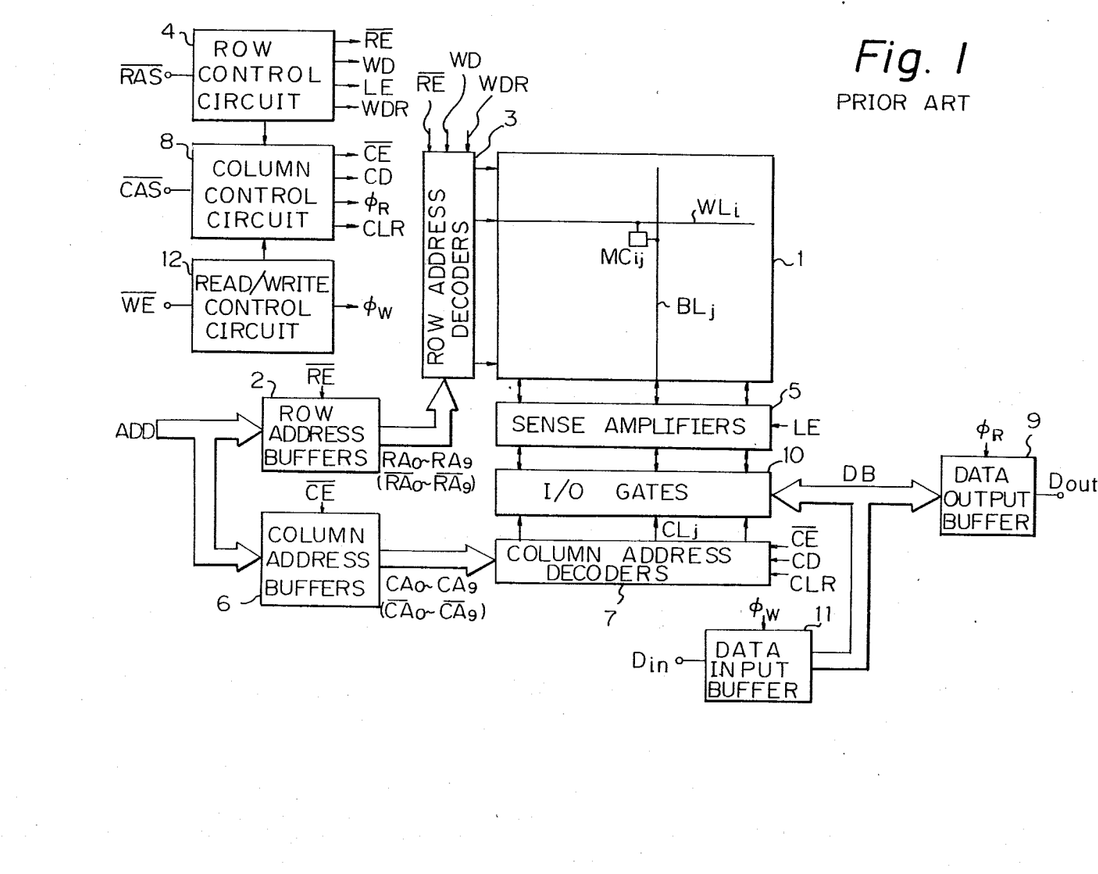
FIG. 1 is a block diagram of a prior art dynamic RAM.

In FIG. 1, which illustrates a prior art dynamic RAM, reference numeral 1 designates a memory cell array which includes 1 Mbit memory cells such as $MC_{ij}$ ($i, j = 0, 1, \ldots, 1023$) linked between word lines such as $WL_i$ ($i=0, 1, \ldots, 1023$) and bit lines such as $BL_j$ ($j=0, 1, \ldots, 1023$).

One of the word lines is selected by row address buffers 2 and row address decoders 3, which are controlled by a row control circuit 4. Upon receipt of an external control signal, i.e., a row address strobe signal $\overline{RAS}$, the row control circuit 4 generates sequentially the following clock signals: a row enable signal $\overline{RE}$, a word line driving signal WD, a latch enable signal LE for sense amplifiers 5, and a word line reset signal WDR.

One of the bit lines, i.e., one column selection line such as $CL_j$ corresponding thereto, is selected by the column address buffers 6 and the column address decoders 7, which are controlled by a column control circuit 8. Upon receipt of an external control signal, i.e., a column address strobe signal $\overline{CAS}$, the column control circuit 8 generates sequentially a column enable signal CE, a column selection line driving signal CD, a clock signal $\phi_R$ for a data output buffer 9, and a column selection line resetting signal CLR. Reference numeral 10 designates input/output gates, each of which is controlled by one of the column selection lines, such as $CL_j$.

Reference numeral 11 designates a data input buffer which is controlled by a read/write control circuit 12. The read/write control circuit 12 receives an external control signal, i.e., a write enable signal $\overline{WE}$, and generates a clock signal $\phi_W$ for the data input buffer 11.

Figure 2A:
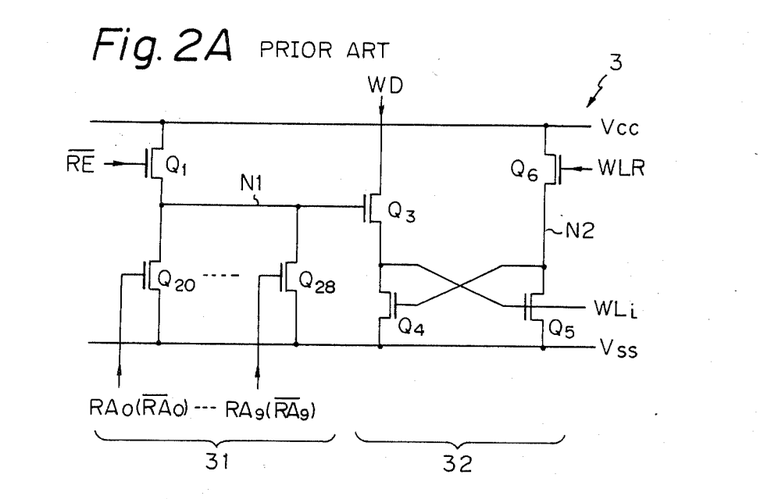
FIGS. 2A and 2B are circuit diagrams of the address decoders of FIG. 1.
Figure 2B:
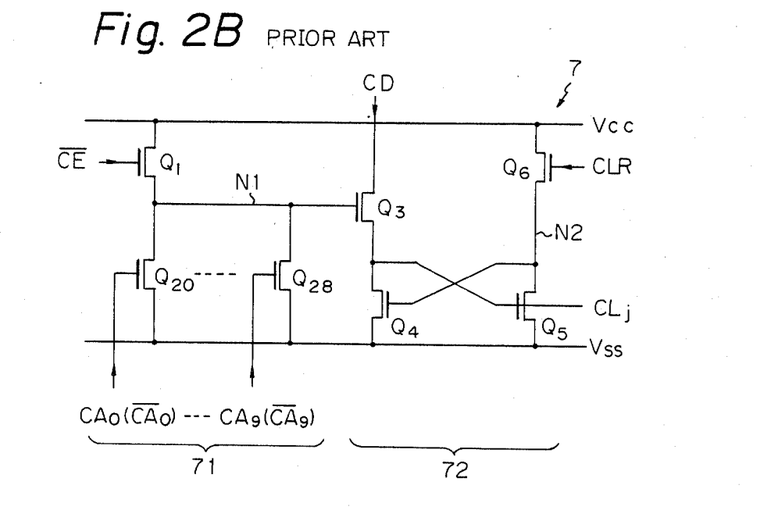

The row address decoders 3 and the column address decoders 7 have the same configuration, as shown in FIGS. 2A and 2B. Note that FIG. 2A illustrates a one-bit decoder for the word line $WL_i$, and FIG. 2B illustrates a one-bit decoder for the column selection line $CL_j$. Each of the decoders of FIGS. 2A and 2B includes a NOR gate portion 31 (71) formed by transistors $Q_1$, $Q_{20}$, ..., and $Q_{28}$ and a driver portion 32 (72) formed by transistors $Q_3$, $Q_4$, $Q_5$, and $Q_6$. The transistor $Q_1$ is controlled by the row enable signal $\overline{RE}$ or the column enable signal $\overline{CE}$, while the transistors $Q_{20}$, ..., $Q_{28}$ are controlled by the row address signals $RA_0$ (or $\overline{RA_0}$) to $RA_9$ (or $\overline{RA_9}$ or the column address signals $CA_0$ (or $\overline{CA_0}$) to $CA_9$ (or $\overline{CA_9}$). When the potential at node N1 is high and the potential of the word line driving signal WD (or of the column selection line driving signal CD) is high, the potential at the word line $WL_i$ (or the column selection line $CL_j$) is high. In addition, when the potential of the word line resetting signal WLR (or of the column selection line resetting signal CLR) is high, the transistor $Q_6$ is turned on, so that the potential at node N2 is high, thereby resetting the word line $WL_i$ (or the column selection line $CL_j$).

Figure 3:
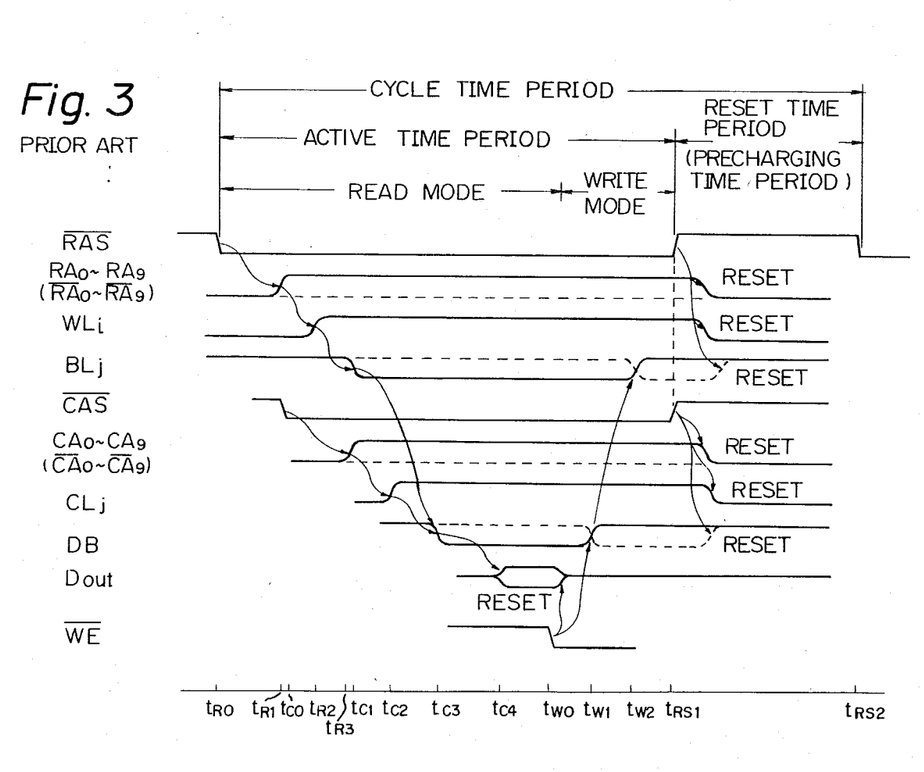
FIG. 3 is a waveform diagram of the operation of the device of FIG. 1.

The operation of the device of FIG. 1 will be explained with reference to FIG. 3. At time $t_{R0}$, the potential of the row address strobe signal $\overline{RAS}$ falls, thereby starting an active operation. Note that such an active operation is defined by the row address strobe signal $\overline{RAS}$. In this case, the row control circuit 4 makes the row enable signal $\overline{RE}$ low, and, as a result, at time $t_{R1}$, the row address buffers 2 generate row address signals $RA_0$, ..., and $RA_9$ of a metal-oxide semiconductor (MOS) level and their inverted signals $\overline{RA_0}$, ..., $\overline{RA_9}$, by receiving external address signals ADD of a transistor-transfer logic (TTL) level, and these address signals are transmitted to the row address decoders 3. Then, at time $t_{R2}$, the row control circuit 4 makes the word line driving signal WD high, so that the row address decoders 3 apply a high-level voltage to the word line $WL_i$, thereby selecting it. After that, at time $t_{R3}$, the row control circuit 4 makes the latch enable signal LE high so as to operate the sense amplifiers 5. Thus, the data stored in the memory cell $MC_{ij}$ is obtained at the bit line $BL_j$.

On the other hand, at time $t_{C0}$ (later than time $t_{R0}$), the potential of the column address strobe signal $\overline{CAS}$ falls. Accordingly, at time $t_{C1}$, the column control circuit 8 makes the column enable signal $\overline{CE}$ low. As a result, the column address buffers 6 generate column address signals $\overline{CA_0}$, ..., and $\overline{CA_9}$ of a MOS level and their inverted signal $\overline{CA_0}$, ..., $\overline{CA_9}$, by receiving external address signals ADD of a TTL level. These signals are transmitted to the column address decoders 7. Note that, in this case, the external address signals ADD are multiplexed for the two kinds of signals. Then, at time $t_{C2}$, the column control circuit 8 makes the column selection line driving signal CD high, so that the column address decoders 7 apply a high-level voltage to the column selection line $CL_j$. As a result, at time $t_{C3}$, the data at the bit line $BL_j$ is transmitted via the input-/output gates 10 to data bus DB, which is connected to the data output buffer 9 and the data input buffer 11. Then, at time $t_{C4}$, the column control circuit 8 makes the clock signal $\phi_R$ high, so as to activate the data output buffer 9, thereby obtaining read data $D_{out}$ at the output thereof. Thus, one read operation for the memory cell $MC_{ij}$ is completed.

Subsequently, at time $t_{W1}$, the potential of the write enable signal $\overline{WE}$ falls, thereby starting a write operation for the same memory cell $MC_{ij}$. In this case, the read/write control circuit 12 controls the column control circuit 8, thereby resetting the data output buffer 9. Then, at time $t_{W1}$, the read/write control circuit 12 makes the clock signal $\phi_W$ high, so that write data $D_{in}$ is transmitted from the data input buffer 11 to the data bus DB. Further, at time $t_{W2}$, the potential at the bit line $BL_j$ changes in response to the potential at the data bus DB. Thus, one write operation is completed.

Then, at time $T_{RS1}$, the potential of the row address strobe signal $\overline{RAS}$ and the potential of the column address strobe signal $\overline{CAS}$ both rise, thereby starting a reset operation for precharging each circuit of the device. That is, the row control circuit 4 makes the signals WD, and LE low and makes the signals $\overline{RE}$ and WDR high, while the column control circuit 8 makes the signal CD low and makes the signals $\overline{CE}$ and CLR high. As a result, the row address signals $RA_0$ to $RA_9$ ($\overline{RA_0}$ to $\overline{RA_9}$), the word line $WL_i$, the bit lines, the column address signals $CA_0$ to $CA_9$ ($\overline{CA_0}$ to $\overline{CA_9}$), the column selection line $CL_j$, and the data bus DB are reset.

After a predetermined reset time period passes, the potential of the row address strobe signal $\overline{RAS}$ again falls, thereby starting another cycle time period.

Thus, in the device of FIG. 1, during the same active time period, a data read operation and a data write operation are both performed upon the same memory cell, thus carrying out a read-modified write operation.

In the device of FIG. 1, however, a reset operation for each portion thereof is carried out only after the potential of the row address strobe signal $\overline{RAS}$ rises. As a result, the reset time period is large, thus increasing the cycle time period.

Figure 4:
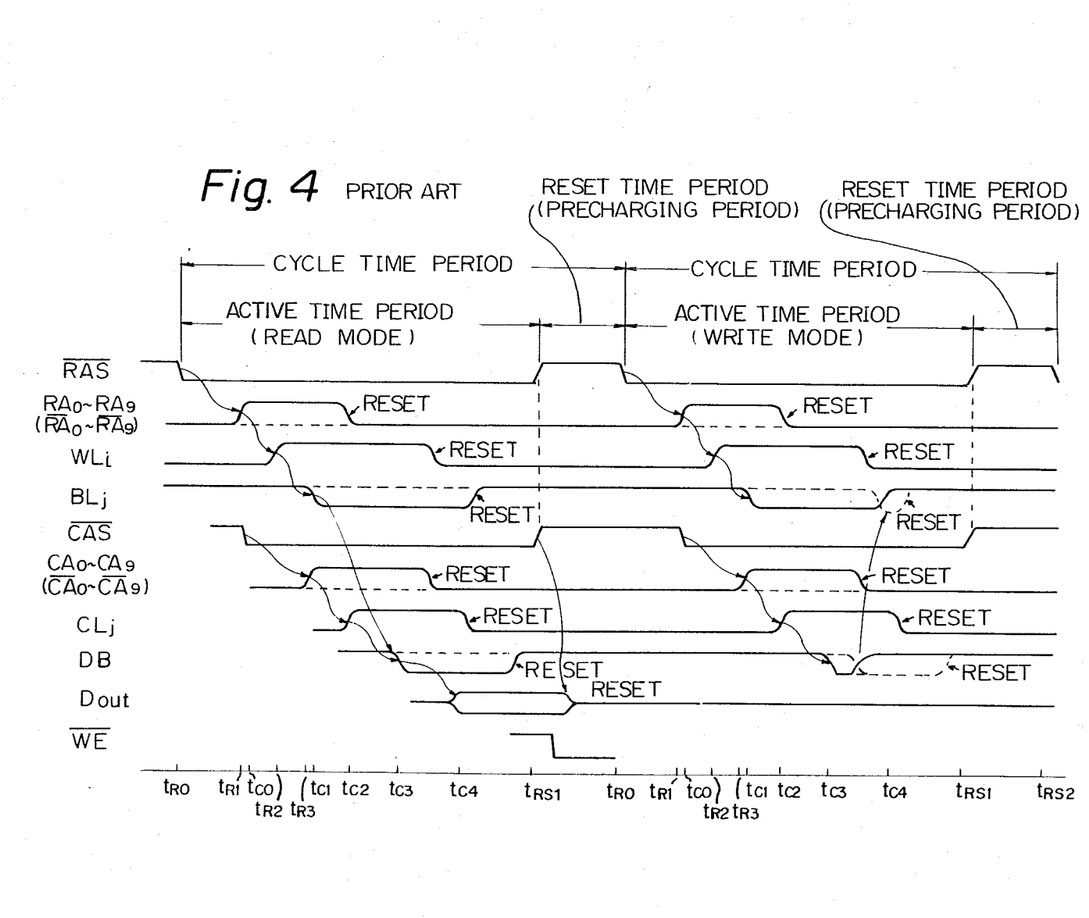
FIG. 4 is a waveform diagram of the operation of another prior art dynamic RAM.

The operation of another prior art dynamic RAM will be explained with reference to FIG. 4 (U.S. Pat. No. 4,376,989). Note that this dynamic RAM has a similar configuration to that of the device of FIG. 1. Therefore, the details of the construction of this device are omitted. In FIG. 4, at time $t_{R0}$, the potential of the row address strobe signal $\overline{RAS}$ falls, thereby starting an active operation, i.e., a read mode. Even in this case, the row control circuit 4 makes the row enable signal $\overline{RE}$ low, and, as a result, at time $t_{R1}$, the row address buffers 2 generate row address signals $RA_0$, ..., and $RA_9$ of a MOS level and their inverted signals $\overline{RA_0}$, ..., $\overline{RA_9}$, by receiving external address signals ADD of a TTL level. These address signals are transmitted to the row address decoders 3. Then, at time $t_{R2}$, the row control circuit 4 makes the word line driving signal WD high, so that the row address decoders 3 apply a high-level voltage to the word line $WL_i$, thereby selecting it. After that, at time $t_{R3}$, the row control circuit 4 makes the latch enable signal LE high so as to operate the sense amplifiers 5. Thus, the data stored in the memory cells is obtained at the bit lines.

In this case, the row address signals $RA_0$ to $RA_9$ and $\overline{RA_0}$ to $\overline{RA_9}$ are automatically reset after the completion of a selecting operation for the word line $WL_i$. That is, the row control circuit 4 makes the row enable signal $\overline{RE}$ high after a predetermined time period from the rising of the word line driving signal WD. Also, the word line $WL_i$ is automatically reset after the completion of operation of the sense amplifiers 5. That is, the row control circuit 4 makes the word line driving signal WD low and makes the word line resetting signal WDR high after a predetermined time period from the rising of the latch enable signal LE.

On the other hand, at time $t_{C0}$ (later than time $t_{R0}$), the potential of the column address strobe signal $\overline{CAS}$ falls. Accordingly, at time $t_{C1}$, the column control circuit 8 makes the column enable signal $\overline{CE}$ low. As a result, the column address buffers 6 generate column address signals $CA_0, \ldots,$ and $CA_9$ of a MOS level and their inverted signal $\overline{CA_0}, \ldots, \overline{CA_9}$, by receiving external address signals ADD of a TTL level. These signals are transmitted to the column address decoders 7. Then, at time $t_{C2}$, the column control circuit 8 makes the column selection line driving signal CD high, so that the column address decoders 7 apply a high-level voltage to the column selection line $CL_j$. As a result, at time $t_{C3}$, the data at the bit line $BL_j$ is transmitted via the input-/output gates 10 to the data bus DB. Then, at time $t_{C4}$, the column control circuit 8 makes the clock signal $\phi_R$ high, so as to activate the data output buffer 9, thereby obtaining read data $D_{out}$ at the output thereof.

In this case, the column address signals $CA_0$ to $CA_9$ and $\overline{CA_0}$ to $\overline{CA_9}$ are automatically reset after the completion of a selecting operation for the column selection line $CL_j$. That is, the column control circuit 8 makes the column enable signal $\overline{CE}$ high after a predetermined time period from the rising of the column selection line driving signal CD. Also, the column selection line $CL_j$ is automatically reset after the completion of a selecting operation for the data output buffer 9. That is, the column control circuit 4 makes the column selection line driving signal CD low and makes the column selection line resetting signal CLR high after a predetermined time period from the rising of the clock signal $\phi_R$. Also, the bit lines and the data bus DB are automatically reset within the active time period.

At time $t_{RS1}$, the potential of the row address strobe signal $\overline{RAS}$ and the potential of the column address strobe signal $\overline{CAS}$ both rise, thereby starting a reset operation for precharging each circuit of the device which has not been reset at this stage. In this case, the data output buffer 9 is reset.

In a dynamic RAM which carries out the operation as shown in FIG. 4, since most of the circuits and the signals are reset before the rising of the row address strobe signal $\overline{RAS}$, it is possible to reduce the reset time period from time $t_{RS1}$ to time $t_{RS2}$, thus reducing the cycle time period. In such a dynamic RAM, however, each circuit or signal is automatically reset or precharged within an active time period defined by the strobe signal, so it is impossible to carry out a read-modified write operation. If it is desired to carry out a write operation upon the same memory cell $MC_{ij}$ accessed by the above-mentioned read mode, a similar operation has to be again carried out after the potential of the row address strobe signal $\overline{RAS}$ falls. Thus, this operation has two cycle time periods as compared with the read-modified write mode which can be completed within a single access cycle in the conventional RAM's.

Figure 5:
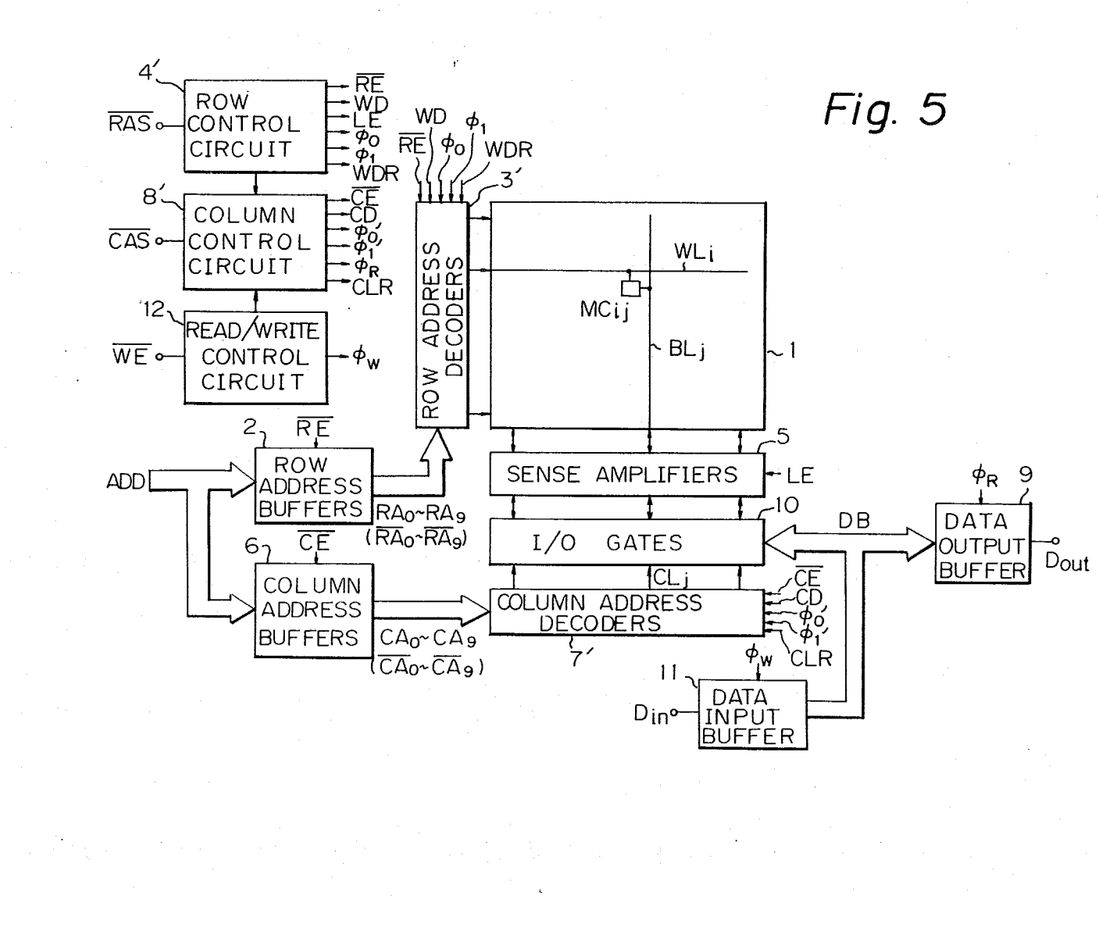
FIG. 5 is a block diagram of an embodiment of the dynamic RAM according to the present invention.

In FIG. 5, which illustrates an embodiment of the dynamic RAM according to the present invention, elements which are the same as those of FIG. 1 are denoted by the same reference numerals. In FIG. 5, each of the row address decoders 3' has a NOR gate portion and a driver portion electrically separable from each other. Such separation of the portions is controlled by the row control circuit 4', which generates clock signals $\phi_0$ and $\phi_1$ therefor. Similarly, each of the column address decoders 7' has a NOR gate portion and a driver portion electrically separable from each other. Such separation of the portions is controlled by the column control circuit 8' which generates clock signals $\phi_0'$ and $\phi_1'$ therefor. The row address decoder 3' and the column address decoder 7' will be explained in more detail later.

Figure 6:
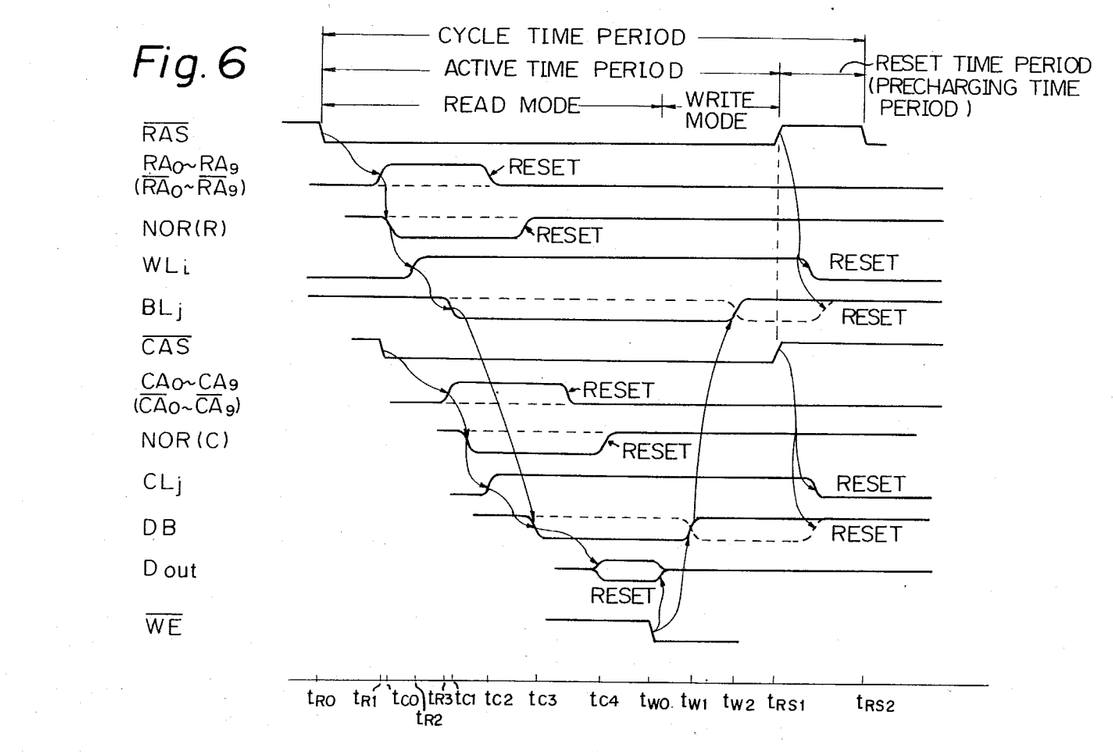
FIG. 6 is a waveform diagram of the operation of the device of FIG. 5.

The operation of the device of FIG. 5 will be explained with reference to FIG. 6. At time $t_{R0}$, the potential of the row address strobe signal $\overline{RAS}$ falls, thereby starting an active operation. In this case, the row control circuit 4' makes the row enable signal $\overline{RE}$ low, and, as a result, at time $t_{R1}$, the row address buffers 2 generate row address signals $RA_0, \ldots,$ and $RA_9$ of a MOS level and their inverted signals $\overline{RA_0}, \ldots, \overline{RA_9}$, by receiving external address signals ADD of a TTL level, and these address signals are transmitted to the row address decoders 3'. Then, at time $t_{R2}$, the row control circuit 4' makes the word line driving signal WD high, so that the row address decoders 3' apply a high-level voltage to the word line $WL_i$, thereby selecting it. After that, at time $t_{R3}$, the row control circuit 4' makes the latch enable signal LE high so as to operate the sense amplifiers 5. Thus, the data stored in the memory cell $MC_{ij}$ is obtained at the bit line $BL_j$.

In this case, the row address signals $RA_0$ to $RA_9$ and $\overline{RA_0}$ to $\overline{RA_9}$ are automatically reset after the completion of a selecting operation for the word line $WL_i$. That is, the row control circuit 4' makes the row enable signal $\overline{RE}$ high after a predetermined time period from the rising of the word line driving signal WD. Also, the NOR gate portions of the decoders 3' are automatically reset after the completion of a selecting operation for the word line $WL_i$. That is, the row circuit 4' makes the clock signal $\phi_0$ low and makes the clock signal $\phi_1$ high after a predetermined time period from the rising of the latch enable signal LE. However, the driver portions of the row address decoder 3', the word line $WL_i$, and the bit lines are not reset until the row address strobe signal $\overline{RAS}$ rises.

On the other hand, at time $t_{C0}$ (later than time $t_{R0}$), the potential of the column address strobe signal $\overline{CAS}$ falls. Accordingly, at time $t_{C1}$, the column control circuit 8' makes the column enable signal $\overline{CE}$ low. As a result, the column address buffers 6 generate column address signals $\overline{CA_0}, \ldots,$ and $\overline{CA_9}$ of a MOS level and their inverted signal $CA_0, \ldots, CA_9$, by receiving external address signals ADD of a TTL level. These signals are transmitted to the column address decoders 7'. Then, at time $t_{C2}$, the column control circuit 8' makes the column selection line driving signal CD high, so that the column address decoders 7' apply a high-level voltage to the column selection line $CL_j$. As a result, at time $t_{C3}$, the data at the bit line $BL_j$ is transmitted via the input/output gates 10 to the data bus DB. Then, at time $t_{C4}$, the column control circuit 8' makes the clock signal $\phi_R$ high, so as to activate the data output buffer 9, thereby obtaining read data $D_{out}$ at the output thereof.

In this case, the row address signals $CA_0$ to $CA_9$ and $\overline{CA_0}$ to $\overline{CA_9}$ are automatically reset after the completion of a selecting operation for the column selection line $CL_j$. That is, the column control circuit 8' makes the column enable signal $\overline{CE}$ high after a predetermined time period from the rising of the column selection line driving signal CD. Also, the NOR gate portions of the column address decoders 7' are automatically reset after the completion of a selecting operation for the data output buffer 9. That is, the column control circuit 8' makes the clock signal $\phi_0'$ low and makes the clock signal $\phi_1'$ high, after a predetermined time period from the rising of the clock signal $\phi_R$. However, the driver portions of the column address decoders 7' and their subsequent circuits are not reset until the column address strobe signal $\overline{CAS}$ rises. Thus, one read operation for the memory cell $MC_{ij}$ is completed.

As explained above, even after the read operation is completed, the driver portions of the row address decoders 3' and their subsequent circuits and the driver portions of the column address decoders 7' and their subsequent circuits are not reset, so that the memory cell MC$_{ij}$ remains in a selected state. In this state, at time t$_{W1}$, the potential of the write enable signal $\overline{\text{WE}}$ falls, thereby starting a write operation for the same memory cell MC$_{ij}$. In this case, the read/write control circuit 12 controls the column control circuit 8', thereby resetting the data output buffer 9. Then, at time t$_{W1}$, the read/write control circuit 12 makes the clock signal $\phi_W$ high, so that write data D$_{in}$ is transmitted from the data input buffer 11 to the data bus DB. Further, at time t$_{W2}$, the potential at the bit line BL$_j$ changes in response to the potential at the data bus DB. Thus, one write operation is completed.

At time t$_{RS1}$, the potential of the row address strobe signal $\overline{\text{RAS}}$ and the potential of the column address strobe signal $\overline{\text{CAS}}$ both rise, thereby starting a reset operation. In this case, the driver portions of the row address decoders 3' and their subsequent circuits, and the driver portions of the column address decoders 7' and their subsequent circuits, are reset.

Thus, in the device of FIG. 5, it is possible to carry out a read-modified write operation. Also, in the device of FIG. 5, since the row address buffers 2, the NOR gate portions of the row address decoders 3', the column address buffers 6, and the NOR gate portions of the column address buffers 7' are automatically reset after their own operations, it is possible to reduce the reset time period (i.e., the period from time t$_{RS1}$ when the potential of the row address strobe signal $\overline{\text{RAS}}$ rises to time t$_{RS2}$ when it falls), thus reducing the cycle time period. That is, in this case, the driver portions of the row address decoders 3' and their subsequent circuits, and the driver portions of the column address decoders 7' and their subsequent circuits, are reset after time t$_{RS1}$. Such a reset operation may be completed before the NOR gate portions of the row address decoders 3' operate at time t$_{R1}'$ of the next cycle period. Therefore, even if the reset time period from time t$_{RS1}$ to time t$_{RS2}$ is small, no problem occurs.

Figure 7A:
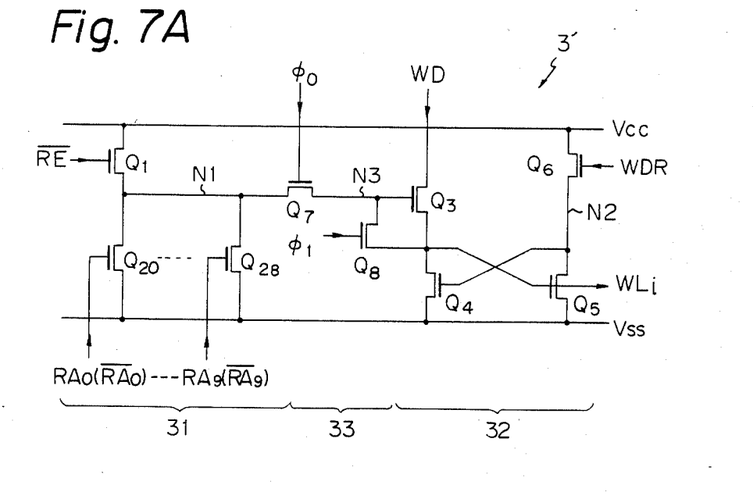
FIGS. 7A and 7B are circuit diagrams of the address decoders of FIG. 5.
Figure 7B:
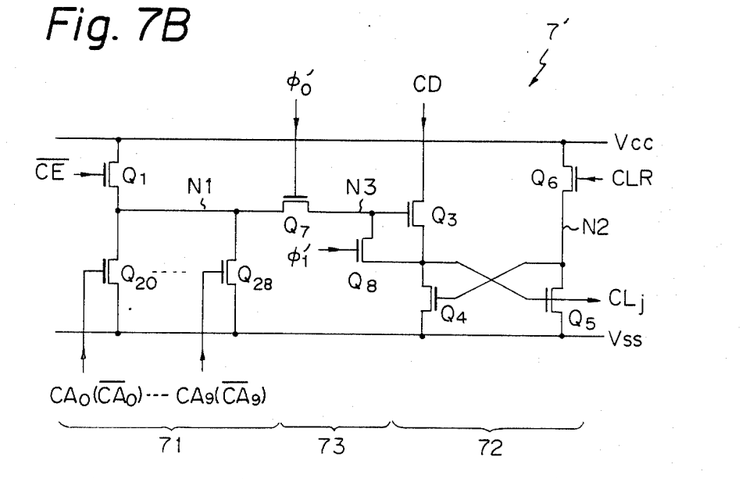

The row address decoders 3' and the column address decoders 7' of FIG. 5 will now be explained with reference to FIGS. 7A and 7B. In FIG. 7A, each of the row address decoders 3' includes a separation circuit 33 formed by transistors Q$_7$ and Q$_8$ linked between the NOR gate portion 31 and the driver portion 32. The transistors Q$_7$ and Q$_8$ of the circuit 33 are controlled by the clock signals $\phi_0$ and $\phi_1$ of the row control circuit 4'. Similarly, in FIG. 7B, each of the column address decoders 7' includes a separation circuit 73 formed by transistors Q$_7$ and Q$_8$ linked between the NOR gate portion 71 and the driver portion 72. The transistors Q$_7$ and Q$_8$ of the circuit 72 are controlled by the clock signals $\phi_0'$ and $\phi_1'$ of the column control circuit 7'.

The operation of each of the row address decoders 4', which is similar to that of each of the column address decoders 7', will be explained with reference to FIG. 8. The case wherein the word line WL$_i$ is selected is illustrated in the upper portion of FIG. 8. In this case, at time t$_o$, when the row address strobe signal $\overline{\text{RAS}}$ falls, the row enable signal $\overline{\text{RE}}$ falls at time t$_1$. As a result, the transistor Q$_1$ is cut off, and, at time t$_2$, the row address signals RA$_0$ (or $\overline{\text{RA}}_0$) to $\overline{\text{RA}}_8$ (or $\overline{\text{RA}}_8$) are applied to the gates of the transistors Q$_{20}$, ..., Q$_{28}$. In the case where the word line WL$_i$ is selected, all the gates of the transistors Q$_{20}$, ..., Q$_{28}$ are at a low level. Accordingly, these transistors are all cut off. As a result, the node N1 is at a high level. At this time, since the clock signal $\phi_0$ is at a high level, the transistor Q$_3$ is in an on state. Since the potential at node N1 is high, the potential at node N3 is also high. In this state, when the word drive signal WD is caused to be high, the gate of the transistor Q$_3$, i.e., the potential at node N3 is further raised by the capacitance between the drain and gate of the transistor Q$_3$ and, simultaneously, the word drive signal WD is transmitted via the transistor Q$_4$ to the word line WL$_i$, so that the potential at the word line WL$_i$ is pulled up to a high level. Next, at time t$_5$, when the clock signal $\phi_0$ becomes low and the signal $\phi_1$ becomes high, the transistor Q$_3$ is cut off so that the NOR gate portion 31 and the driver portion 32 are separated electrically from each other. In this case, since the potential at node N3 is higher than the power supply voltage V$_{cc}$, and the potential at the word line WL$_i$ and the clock signal $\phi_1$, are both high, the transistor Q$_5$ is cut off and the word line WL$_i$ remains high. Next, at time t$_6$ the row address signals RA$_0$ (or $\overline{\text{RA}}_0$) to RA$_9$ (or $\overline{\text{RA}}_9$) are reset so that they become low, and, in addition, the potential of the row enable signal $\overline{\text{RE}}$ is changed from low to high. As a result, the transistor Q$_1$ of the NOR gate portion 31 is turned on so as to precharge node N1, thereby resetting the NOR gate portion 31. However, since the transistor Q$_8$ is cut off so that the NOR gate portion 31 and the driver portion 32 are separated electrically from each other, even when the NOR gate portion 31 is reset, no problem occurs.

The output potential of the driver portion 32, i.e., the potential at the word line WL$_i$, remains high, and the NOR gate portion 31 and its pre-stages are reset. In this state, if necessary, the write enable signal $\overline{\text{WE}}$ is caused to be low, thereby carrying out a write operation. At time t$_7$, when the row address strobe signal $\overline{\text{RAS}}$ is again caused to be high, the word line driving signal WD is caused to be low, and the word line resetting signal WDR is caused to be high. As a result, the transistor Q$_6$ is turned on so as to pull up the potential at node N2. Thus, the transistor Q$_4$ is turned on and the transistor Q$_5$ is turned off, so that the potential at the word line WL$_i$ is caused to be low, that is, the word line WL$_i$ is reset.

After the word line WL$_i$ is reset, the clock signal $\phi_1$ is pulled down to a low level and the signal $\phi_0$ is pulled up to a high level. As a result, the transistor Q$_8$ is cut off and the transistor Q$_7$ is turned on.

Figure 8:
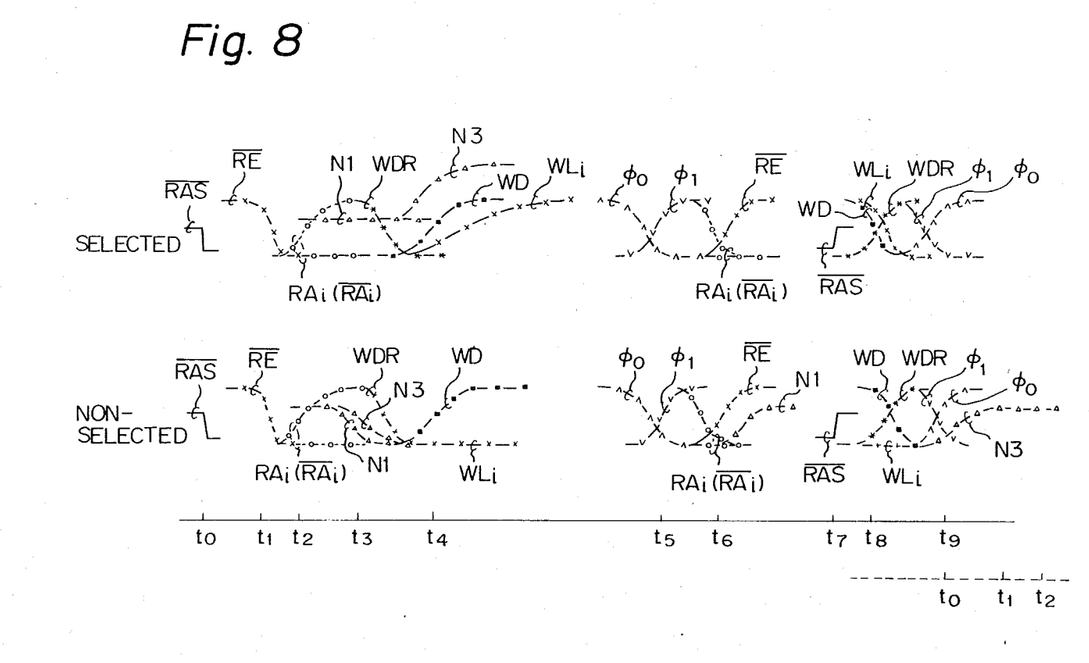
FIG. 8 is a waveform diagram of the operation of the circuit of FIG. 7A.

The case wherein the word line WL$_i$ is not selected is illustrated at the lower portion of FIG. 8. In this case, when the row address strobe signal $\overline{\text{RAS}}$ falls and the row enable signal $\overline{\text{RE}}$ falls, the address signals applied to the gates of the transistors Q$_{20}$, ..., Q$_{28}$ turn on at least one of the transistors Q$_{20}$, ..., Q$_{28}$. As a result, at time t$_3$, the potential at node N1 is changed from high to low. At this time, since the clock signal $\phi_0$ is at a high level, the transistor Q$_3$ is in an on state. Therefore, the potential at node N3 is changed from high to low. In this state, at time t$_4$, even when the word line driving signal WD is caused to be high, the transistor Q$_4$ is cut off. Therefore, the word line WL$_i$ remains low. Next, at time t$_5$, when the clock signal $\phi_0$ is caused to be low and the clock signal $\phi_1$ is caused to be high, the transistor Q$_7$ is cut off so that the NOR gate portion 31 and the driver portion 32 are separated electrically from each other. In this state, the transistor Q$_8$ is turned on, so that the potential at node N3 is clamped at a low level, thereby preventing the potential at node N3 from being in a high-level floating state by the application of the word line driving signal WD, which is helpful in stabilization of the memory access operation. Next, at time $t_6$, the row address signals $RA_0$ (or $\overline{RA_0}$) to $RA_9$ (or $\overline{RA_9}$) become low. In addition, the row enable signal $\overline{RE}$ is changed from low to high. As a result, the transistor $Q_1$ of the NOR gate portion 31 is turned on so as to precharge node N1, since all the transistors $Q_{20}, \ldots,$ and $Q_{28}$ are turned off. At time $t_7$, when the row address strobe signal $\overline{RAS}$ is again caused to be high, the word line driving signal WD is caused to be low, and the word resetting signal WDR is caused to be high, thereby resetting the word line $WL_i$. However, in the case where the word line $WL_i$ is not selected, the word line $WL_i$ was already low, so that the potential of the word line $WL_i$ is unchanged.

After the word line $WL_i$ is reset, the clock signal $\phi_1$ is pulled down to a low level and the clock signal $\phi_0$ is pulled up to a high level. As a result, the transistor $Q_8$ is cut off and the transistor $Q_7$ is turned on. The conduction of the transistor $Q_7$ charges up node N3 by node N1. At the time when the charging-up operation is completed, a stand-by state for the next cycle time period is established.

Here, since it takes a time period from $t_0$ to $t_2$ for the row address buffer 2 to generate the row address signals $RA_0$ to $RA_9$ and $\overline{RA_0}$ to $\overline{RA_9}$, it is possible to start the next cycle time period at time $t_9$ when the clock signals $\phi_0$ and $\phi_1$ are reversed. Thus, it is possible to reduce the reset time period, i.e., the precharging time period, from $t_7$ to $t_8$.

As explained above, according to the present invention, it is possible to reduce the reset time period, thereby reducing the cycle time period. In addition, since the dynamic RAM according to the present invention can carry out a read-modified write operation, the device according to the present invention is compatible with conventional dynamic RAM's. Further, the dynamic RAM according to the present invention has no static circuits therein, so that this device has low power consumption.

I claim:

1. A dynamic random access memory having an internal circuit and connected to receive an external control signal comprising:
   address buffer means;
   address decoder means having NOR gate means connected to said address buffer means and driver means connected to the internal circuit;
   active means for applying address signals, via said address buffer means to said address decoder means, so as to perform a memory access operation upon the internal circuit when said active means receives the external control signal, said active means defining an active time period;
   first reset means for resetting said address buffer means and said NOR gate means of said address decoder means within a predetermined time period shorter than the active time period defined by said active means; and
   second reset means for resetting said driver means of said address decoder means in response to the external control signal.

2. A memory as set forth in claim 1, wherein said address decoder means comprises means, connected between said NOR gate means and said driver means, for electrically separating said NOR gate means from said driver means at least during a time period between the time said first reset means performs its resetting operation and the time said second reset means performs its resetting operation.

3. A memory as set forth in claim 1 wherein:
   said active means generates first and second control signals;
   said address buffer means comprises row address buffers controlled by the first control signal and column address buffers controlled by the second control signal.

4. A memory as set forth in claim 2, further comprising first and second power supply terminals, wherein:
   said active means generates first, second, third, fourth and fifth control signals;
   said NOR gate means comprises:
     a first transistor having a drain connected to said first power supply terminal, having a gate controlled by the first control signal of said active means, and having a source; and
     a plurality of second transistors connected in parallel, each having a drain connected to the source of said first transistor, having a gate controlled by a corresponding one of the address signals, and having a source connected to said second power supply terminal;
   said driver means comprises:
     a third transistor having a drain controlled by the second control signal of said active means, having a gate, and having a source;
     fourth and fifth transistors crosscoupled with each other, said fourth transistor being connected between said third transistor and said second power supply terminal, said fifth transistor being connected to said second power supply terminal and the internal circuit; and
     a sixth transistor having a drain connected to the first power supply terminal, having a gate controlled by the third control signal of said active means, and having a source connected to the fifth transistor;
   said electrical separating means comprises:
     a seventh transistor having a drain connected to the source of said first transistor, having a gate controlled by the fourth control signal of said active means, and having a source connected to the gate of said third transistor; and
     an eighth transistor having a drain connected to the gate of said third transistor, having a gate controlled by the fifth control signal of said active means, and having a source connected to the source of said third transistor.

5. A dynamic random access memory including a memory cell array and connected to receive a first external control signal defining an active time period and a second external control signal, comprising:
   control means, connected to receive the first and second external control signals, for generating first and second enable signals and first, second, third and fourth reset signals in dependence upon the first and second external control signals;
   address buffer means, connected to said control means, for receiving the first and second enable signals and for providing first and second address signals;
   a first decoder circuit, connected to said control means, said address buffer means and the memory cell array, for accessing the memory cell array based on the first address signals and the first enable signal, said first decoder circuit including:
- a first NOR gate circuit, connected to said control means, for receiving the first enable signal;
- a first separation circuit, connected to said first NOR gate circuit and said control means, for receiving the first reset signal; and
- a first driver circuit, connected to said first separation circuit and the memory cell array, for receiving the second reset signal, said first NOR gate circuit being reset in dependence upon the first reset signal within a predetermined time period during the active time period defined by the first external control signal, said first driver circuit being reset in response to the second reset signal;

a second decoder circuit, connected to said control means, said address buffer means and the memory cell array, for accessing the memory cell array based on the second address signals and the second enable signal, said second decoder circuit including:
- a second NOR gate circuit, connected to said control means, for receiving the second enable signal;
- a second separation circuit, connected to said second NOR gate circuit and said control means, for receiving the third reset signal; and
- a second driver circuit, connected to said second separation circuit and the memory cell array, for receiving the fourth reset signal, said second NOR gate circuit being reset in dependence upon the third reset signal within a predetermined time period during the active time period defined by the first external control signal, said second driver circuit being reset in response to the fourth reset signal.

* * * * *

UNITED STATES PATENT AND TRADEMARK OFFICE
CERTIFICATE OF CORRECTION

PATENT NO. : 4,581,722
DATED : APRIL 8, 1986
INVENTOR(S) : YOSHIHIRO TAKEMAE

It is certified that error appears in the above-identified patent and that said Letters Patent is hereby corrected as shown below:

Col. 3, line 7, "(or $RA_0$)" should be --(or $\overline{RA_0}$)--;

line 8, "(or $RA_9$" should be --(or $\overline{RA_9}$)--;

line 9, "$CA_0$" should be --$\overline{CA_0}$--;

line 9, "(or $CA_9$)" should be --(or $\overline{CA_9}$)--;

line 28, "$RA_0$" should be --$\overline{RA_0}$--.

Col. 7, line 66, "to $\overline{RA_8}$" (first occurrence) should be --to $RA_8$--.

Signed and Sealed this

Twenty-second Day of July 1986

[SEAL]

Attest:

DONALD J. QUIGG

Attesting Officer

Commissioner of Patents and Trademarks